United States Patent
Forstner et al.

(10) Patent No.: US 10,114,083 B2
(45) Date of Patent: Oct. 30, 2018

(54) MAGNETOMETER AND METHOD OF FABRICATION

(71) Applicant: THE UNIVERSITY OF QUEENSLAND, St. Lucia, Queensland (AU)

(72) Inventors: Stefan Forstner, Brisbane (AU); Eoin Sheridan, Brisbane (AU); Warwick P. Bowen, Brisbane (AU)

(73) Assignee: THE UNIVERSITY OF QUEENSLAND, Queensland (AU)

( * ) Notice: Subject to any disclaimer, the term of this patent is extended or adjusted under 35 U.S.C. 154(b) by 24 days.

(21) Appl. No.: 15/023,637

(22) PCT Filed: Sep. 19, 2014

(86) PCT No.: PCT/AU2014/000921
§ 371 (c)(1),
(2) Date: Mar. 21, 2016

(87) PCT Pub. No.: WO2015/039171
PCT Pub. Date: Mar. 26, 2015

(65) Prior Publication Data
US 2016/0209478 A1 Jul. 21, 2016

(30) Foreign Application Priority Data

Sep. 20, 2013 (AU) .............................. 2013903621

(51) Int. Cl.
*G01R 33/032* (2006.01)
*G01R 33/05* (2006.01)
(Continued)

(52) U.S. Cl.
CPC ........... *G01R 33/0327* (2013.01); *G01R 3/00* (2013.01); *G01R 33/05* (2013.01); *G01R 33/091* (2013.01);
(Continued)

(58) Field of Classification Search
CPC .... G01R 33/0327; G01R 33/091; G01R 3/00; G01R 33/0206; G01R 33/028; G01R 33/038; G01R 33/1215; B64G 1/366; G01N 24/006
USPC ...................................................... 324/244.1
See application file for complete search history.

(56) References Cited

U.S. PATENT DOCUMENTS 6,344,743 B1 * 2/2002 Holmes ................ G01R 33/045
324/244.1
2010/0148770 A1 * 6/2010 Crowe ................ G01R 33/032
324/244.1

OTHER PUBLICATIONS

E. Sheridan, S. Forstner, J. Knittel, H. Rubinsztein-Dunlop, and W. P. Bowen, "Cavity Optomechanical Magnetometer," in Imaging and Applied Optics Technical Papers, OSA Technical Digest (online) (Optical Society of America, Monterey, California United States Jun. 24-28, 2012), paper STu4F.5.*
(Continued)

*Primary Examiner* — Tung X Nguyen
*Assistant Examiner* — Robert P Alejnikov, Jr.
(74) *Attorney, Agent, or Firm* — Nixon & Vanderhye P.C.

(57) ABSTRACT

An optical magnetometer comprising: an optical resonator having a central void; and a magnetostrictive material located in the central void such that a change in dimension of the magnetostrictive material causes a change in mechanical modes of the optical resonator. Also a method of making the optical magnetometer.

8 Claims, 5 Drawing Sheets

(51) Int. Cl.
  *G01R 33/18* (2006.01)
  *G01R 3/00* (2006.01)
  *G01R 33/09* (2006.01)
  *G01D 5/353* (2006.01)

(52) U.S. Cl.
  CPC ......... *G01R 33/18* (2013.01); *G01D 5/35348* (2013.01); *G01D 5/35377* (2013.01)

(56) References Cited

OTHER PUBLICATIONS

International Search Report for PCT/AU2014/000921 dated Nov. 28, 2014, 4 pages.
Sheridan et al., "Cavity Optomechanical Magnetometer", *Optical Society of America* 2012, Optical Sensors Conference Monterey California USA, Jun. 24-28, 2012, 3 pages.
Forstner et al., "Cavity optomechanical magnetometer", *American Physical Society 2012, Physical review letters*, vol. No. 108, issue 12, Mar. 21, 2012, 4 pages.
Preusser et al., "A microfabricated photonic magnetometer", *IEEE 2008, Sensors 2008 IEEE Conference*, Oct. 26-29, 2008, pp. 344-346.
Spillane et al., "Ultrahigh-Q toroidal mircoresonators for cavity quantum electrodynamics", *The American Physical Society* 2005, *in Physical Review A* 71, 013817 (2005), Jan. 26, 2005, pp. 013817-1 to 0138171-10.
Chollet et al., A (not so) short introduction to MEMS, Memscyclopedia. org, <Retrieved from the Internet>, Mar. 20, 2013, 208 pages.

\* cited by examiner

GRAPH 1

Fig. 10

MAGNETOMETER AND METHOD OF FABRICATION

This application is the U.S. national phase of International Application No. PCT/AU2014/000921 filed 19 Sep. 2014 which designated the U.S. and claims priority to AU Patent Application No. 2013903621 filed 20 Sep. 2013, the entire contents of each of which are hereby incorporated by reference.

FIELD OF THE INVENTION

The present invention relates to the field of detection of magnetic fields. More particularly, the invention relates to an optical magnetometer and a method of fabricating an optical magnetometer.

BACKGROUND TO THE INVENTION

In our earlier filed application (WO2012142654) we described a magnetometer useful for detecting micro-magnetic fields. The magnetometer comprised a microcavity having optical modes and mechanical modes. A tunable laser was tuned to produce optical radiation at a frequency locked to an optical mode of the microcavity and was evanescently coupled into the microcavity. A magnetostrictive material was attached to the microcavity so that a change in the dimensions of the magnetostrictive material under the influence of a magnetic field was translated to stress in the microcavity causing a change in the mechanical modes of the microcavity. The change in the mechanical modes were detectable on the optical radiation.

Another example of a microresonator coated with a magnetostrictive material is described in U.S. Pat. No. 8,125,644 assigned to Raytheon Corporation. The Raytheon device detects changes in optical mode as a result of changes in the optical cavity caused by a change of dimension of the magnetostrictive material in a magnetic field. What is measured is a shift in the frequency or wavelength) of the resonant optical mode.

These devices are attractive because they are useful in a range of applications requiring measurement of very weak magnetic fields, such as neural mapping. As explained in WO2012142654, the current preferred devices for detecting magnetic fields in the femtoTesla to picoTesla range are Superconducting Quantum Interference Devices (SQUIDS) but these devices have significant handling disadvantages.

Another optical approach to magnetometry, using nitrogen vacancy (NV) centres in diamond as demonstrated in D. Le Sage, L. M. Pham, N. Bar-Gill, C. Belthangady, M. D. Lukin, A. Yacoby, and R. L. Walsworth "Efficient photon detection from color centers in a diamond optical waveguide" Physical Review B, 85, 121202(R) (2012), has also recently gained traction. This approach can achieve excellent sensitivity down to 100 pT, but the diamond substrate presents significant challenges for integration in a chip-based architecture. Additionally, the bandwidth is limited to about 2 MHz, which could limit sensitivity to magnetic resonance signals (MRI).

Optical magnetometry (using resonant cavities coated with magnetostrictive materials) have shown potential for a range of applications. Devices with better sensitivity are needed for optical magnetometry to be useful for microfluidic magnetic resonance imaging, neural imaging, and study of interesting systems like spin physics in condensed matter.

SUMMARY OF THE INVENTION

In one form, although it need not be the only or indeed the broadest form, the invention resides in an optical magnetometer comprising:
an optical resonator having a central void; and
a magnetostrictive material located in the central void such that a change in dimension of the magnetostrictive material causes a change in mechanical modes of the optical resonator.

In a further form, the invention resides in an optical magnetometer comprising:
an optical resonator having optical modes and mechanical modes, the optical resonator having a central void;
a tunable laser producing optical radiation at a laser frequency locked to an optical mode frequency of the optical resonator and coupled into the optical resonator;
a magnetostrictive material located in the central void such that a change in dimension of the magnetostrictive material causes a change in mechanical modes of the optical resonator; and
an optical detector that detects changes in the optical radiation due to changes in the mechanical modes.

The optical resonator is suitably a circular or elliptical whispering galley mode resonator where the light circulates by grazing incidence total internal reflection around the perimeter of the resonator. The optical resonator may have a diameter in the range of a few micrometers to a few centimeters. Preferred dimensions are a diameter from about 5 microns to about 30 millimeters, but more preferably a diameter in the range of about 60 micron to about 16 millimeters. The optical resonator may be a microtoroid.

The optical resonator may be a substantially rectangular resonator, preferably square, where light circulates by reflection from dielectric coatings on the surface of the resonator.

The magnetostrictive material may be selected from Terfenol-D (an alloy of terbium, dysprosium and iron), Galfenol (an alloy of iron and gallium), Metglas® (a proprietary iron based amorphous alloy available from Metglas Inc), Ferrite (doped crystalline iron), or other materials demonstrating magnetostrictive properties.

In a yet further form the invention resides in a method of fabricating an optical magnetometer including the steps of:
forming an optical resonator having a central void; and
locating a magnetostrictive material in the void.

The method may include forming the optical resonator around the magnetostrictive material or placing the magnetostrictive material into the void after forming.

The optical resonator may be formed with a central void by one or more of: chemical etching; focussed ion beam milling; electron beam lithography; diamond turning; laser ablation, or drilling.

The magnetostrictive material may be placed in the void by manual placement or sputtering. The magnetostrictive material may be held in the void by interference fit, chemical bonding, or physical bonding (epoxy).

In a still further form the invention resides in a method of fabricating an optical magnetometer including the steps of:
depositing a ring of photoresist on a silicon wafer having a thermally grown silica top layer;
transferring the pattern into the silica layer with a buffered oxide HF etch;
etching the silica layer with $XeF_2$ to form a silica disk with a central void;
reflowing the silica disk with a $CO_2$ laser to form a silica torus; and bonding a disk of magnetostrictive material into the central void with epoxy, the disk having a diameter of approximately, but no greater than, the diameter of the central void.

Further features and advantages of the present invention will become apparent from the following detailed description.

BRIEF DESCRIPTION OF THE DRAWINGS

To assist in understanding the invention and to enable a person skilled in the art to put the invention into practical effect, preferred embodiments of the invention will be described by way of example only with reference to the accompanying drawings, in which.

DETAILED DESCRIPTION OF THE INVENTION

Embodiments of the present invention reside primarily in an optical magnetometer and methods of fabricating an optical magnetometer. Accordingly, the elements have been illustrated in concise schematic form in the drawings, showing only those specific details that are necessary for understanding the embodiments of the present invention, but so as not to obscure the disclosure with excessive detail that will be readily apparent to those of ordinary skill in the art having the benefit of the present description.

In this specification, adjectives such as first and second, left and right, and the like may be used solely to distinguish one element or action from another element or action without necessarily requiring or implying any actual such relationship or order. Words such as "comprises" or "includes" are intended to define a non-exclusive inclusion, such that a process, method, article, or apparatus that comprises a list of elements does not include only those elements but may include other elements not expressly listed, including elements that are inherent to such a process, method, article, or apparatus.

Figure 1:
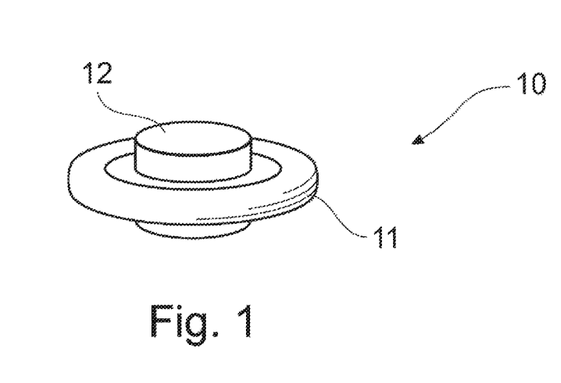
FIG. 1 is a sketch of an optical magnetometer according to one embodiment of the invention.
Figure 2:
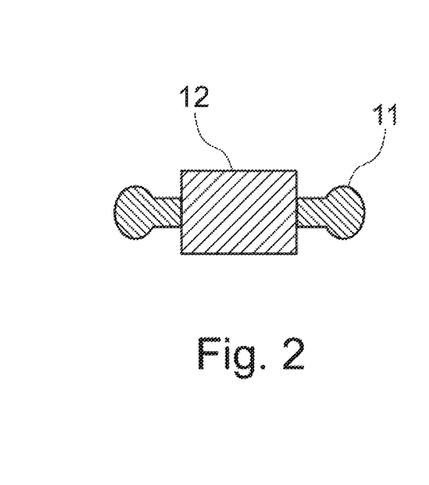
FIG. 2 is a side view of the optical magnetometer of FIG. 1.
Figure 3:
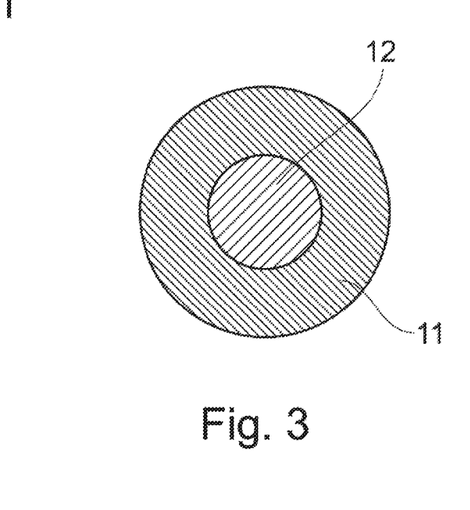
FIG. 3 is a top view of the optical magnetometer of FIG. 1.

Referring to FIG. 1 there is shown a schematic of a first embodiment of an optical, magnetometer 10. The optical magnetometer 10 comprises an optical resonator 11 having a central void with a magnetostrictive material 12 located in the central void. The structure is shown more clearly in FIG. 2 which is a sectional side view of the embodiment of FIG. 1 taken through a diameter of the optical magnetometer, and in FIG. 3 which is a plan view of the optical magnetometer of FIG. 1.

Reference is made to the description of operating the magnetometer outlined in WO2012142654. In brief, by reference to FIG. 4 (which is a schematic block diagram of the operation of an optical magnetometer 40), there is shown an optical resonator 41 having a central void. A tunable laser 42 generates a laser beam that is coupled to an optical fibre 43. Any tunable laser may be chosen that generates an output at an appropriate frequency for the optical cavity modes of the optical resonator. The output of the laser 42 is evanescently coupled into the optical resonator 41 via a tapered section 44 of the optical fibre 43. Optical radiation is coupled out of the optical resonator in the same manner. The tapered portion 44 of the optical fibre 43 abuts the optical resonator 41. Light exiting the optical fibre 43 is detected by a photodiode 45, or other suitable photodetector. A signal from the photodetector is fed back to a laser controller 46. A phase locked loop is suitably employed to lock the laser output to an optical cavity mode of the optical resonator 41.

Figure 4:
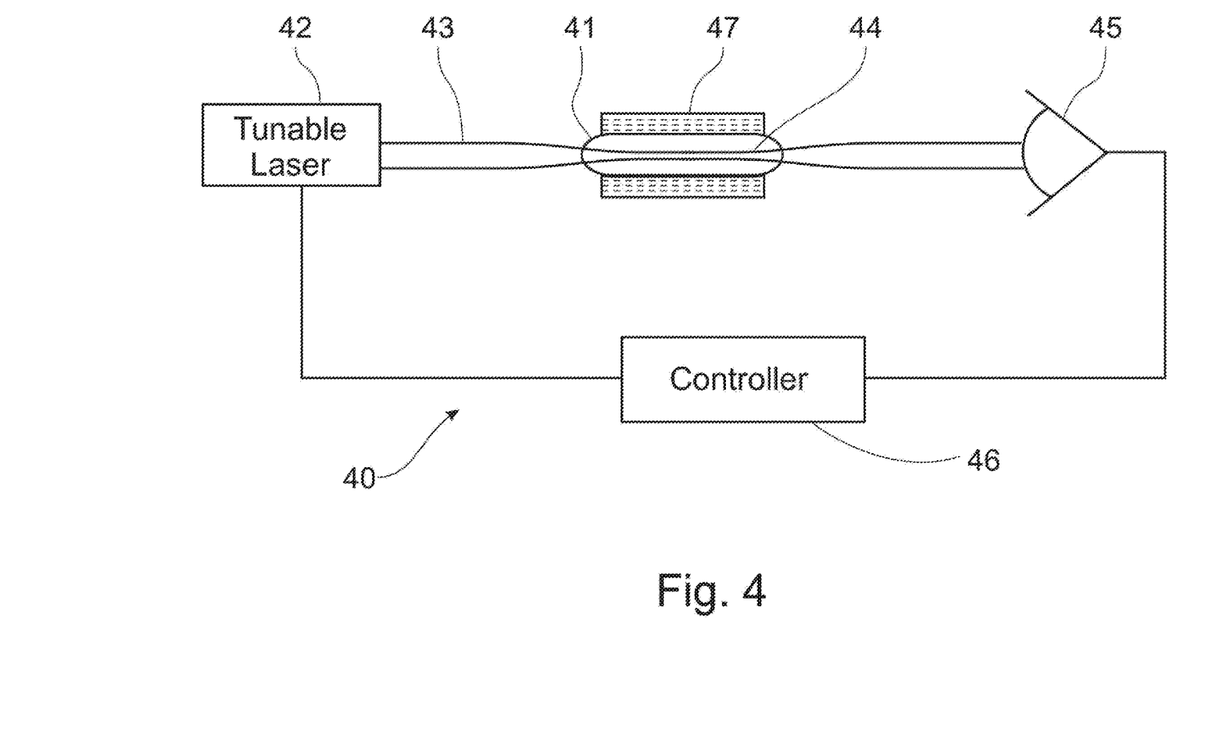
FIG. 4 is a schematic block diagram of the operation of an optical magnetometer of FIG. 1.
Figure 5A:
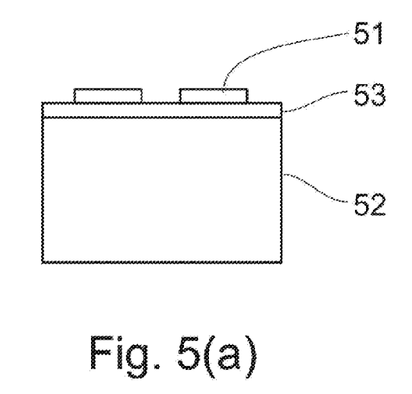
FIG. 5 is a series of sketches showing one method of fabricating the optical magnetometer of FIG. 1.
Figures 5B, 5E:
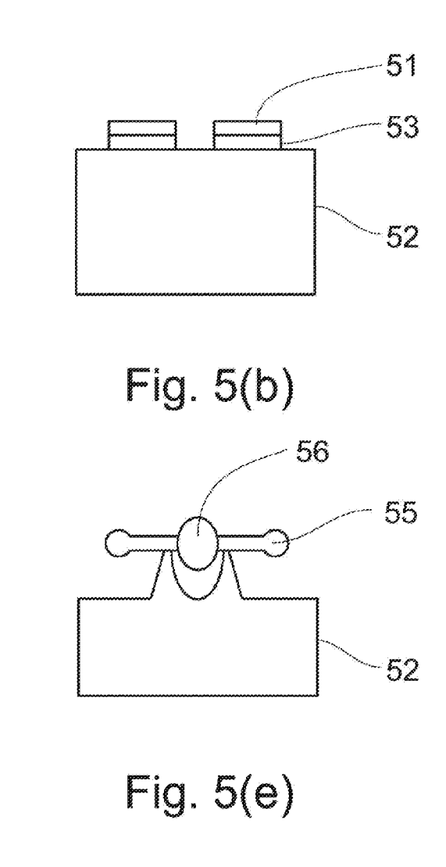
Figure 5C:
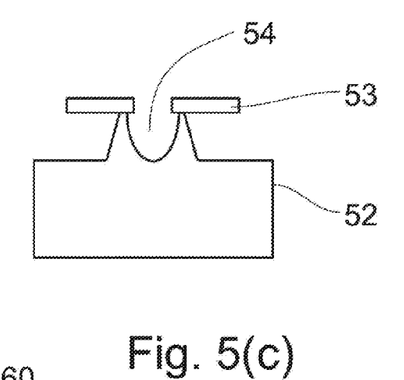
Figure 5D:
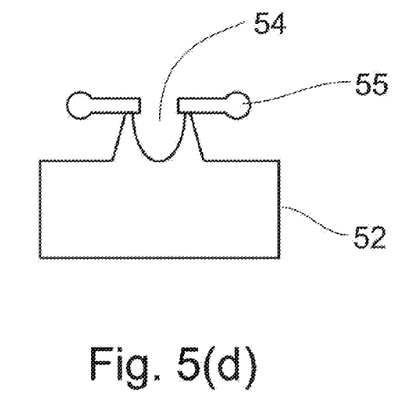

When the laser is locked to an optical cavity mode and the frequency spectrum of the lock signal is measured, a number of fine structure peaks are observed. The fine structure in the frequency spectrum comes from mechanical modes of the optical resonator. This fine structure arises from thermal vibrations of mechanical modes.

A block of magnetostrictive material 47 is bonded into the central void in the manner described in detail below. Any change in the dimensions of the magnetostrictive material 47 due to an applied magnetic field results in a change in the dimensions of the optical resonator and hence a change in the mechanical modes. The change in the vibration of the mechanical modes is evident in the measured fine structure and can be used to calculate the applied magnetic field, in the manner described in WO2012142654 and elsewhere.

The effect of change in dimension of the magnetostrictive material 47 is much greater when the magnetostrictive material is located within the central void of the optical resonator 41 than was achievable in the design described in WO2012142654. This can be best understood by considering the behavior of magnetostrictive material in a magnetic field. When a magnetic field is applied with a field direction parallel to the axis of the cylindrical disk of magnetostrictive material 47 shown in FIG. 4, the magnetostrictive material will expand in a direction parallel to the field and contract in a perpendicular direction. The contraction pulls on the optical resonator thus causing a change in dimension and hence a change in mechanical modes. If the applied magnetic field is perpendicular to the cylindrical axis the cylinder will expand radially and contract longitudinally. The radial expansion pushes on the optical resonator and thus causes a change in dimension and hence a change in the vibration of the mechanical modes.

The inventors have surprisingly found that the effect is much greater when the magnetostrictive material is acting radially against the resonator than could be achieved by merely coating magnetostrictive material onto a surface of a solid optical resonator.

In order to more fully exemplify the invention a number of examples of different embodiments of optical magnetometers are described below. The range of examples is not meant to be an exhaustive range of possibilities. Persons of ordinary skill in the art, armed with the disclosure herein, will be able to vary the embodiments while relying on the inventive concepts.

Example 1

A silica microtoroidal resonator with a central void is formed by the fabrication steps outlined in FIG. 5. FIG. 5(a) shows the formation of a ring of photoresist 51 patterned on the top surface of a silicon wafer 52 having a thermally grown silica top-layer 53 (~2 μm thick) using standard photolithographic techniques. A hydrogen fluoride (HF) wet etch is used to transfer the pattern into the silica layer as shown in FIG. 5(b). A xenon difluoride ($XeF_2$) gas etch undercuts the silica disk and etches a central void 54 in the supporting silicon pedestal, as shown in FIG. 5(c). The silica disk is shaped by $CO_2$ laser reflow to form the optical resonator 55. Laser reflow is a process of heating the top of the silica ring momentarily with a $CO_2$ laser beam so that the outer edge briefly melts, forming a near perfect torus and then (after the laser pulse has ceased) solidifies so that it maintains the toroidal shape. This structure is shown in FIG. 5(d) before the introduction of the magnetostrictive material. The structure exhibits whispering gallery modes due to grazing incidence total internal reflection around the perimeter of the silica material. A piece of Terfenol-D, shown in FIG. 5(e) as a ball 56, is located in the void using a micromanipulator and held in place with epoxy.

In a variation of this embodiment, the Terfenol-D could be sputter coated into the central void through a physical mask.

Example 2

An elliptical silicon disk resonator is fabricated using standard photolithographic fabrication techniques. A central void is formed in the top of the disk using an ablative beam technique such as focused ion beam milling or electron beam lithography. Metglas® is ground into microscale particles. Metglas® is a proprietary material available from Metglas Inc of 440 Allied Drive, Conway, S.C.

One of the particles is selected under a microscope and manipulated using a micromanipulator. The micromanipulator is used to manually place the Metglas® particle inside the central void of the elliptical silicon disk resonator. The Metglas® is held in place using epoxy, which is applied using the micromanipulator.

Example 3

A crystalline optical resonator is formed by polishing an optically transparent crystal (such as calcium fluoride, $CaF_2$) into a disk. A central void is formed inside the disk by diamond turning. A galfenol rod is diced to form a disk of appropriate size to fit inside the void. The galfenol can be strained (contracted) by application of an appropriate magnetic field. This allows the galfenol to be manually placed inside the void. When the strain is removed the galfenol expands and is held in place by mechanical force.

Figure 6:
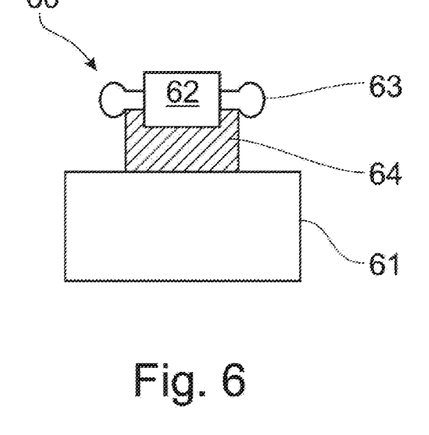
FIG. 6 is a sketch of an optical magnetometer according to a second embodiment of the invention.

For use the magnetometer 60 may be mounted on a silicon block 61 as shown in FIG. 6. The galfenol rod 62 is held in the central void of the $CaF_2$ optical resonator 63. An elastic material 64 holds the magnetometer 60 but allows for free expansion and contraction.

Example 4

Figure 7:
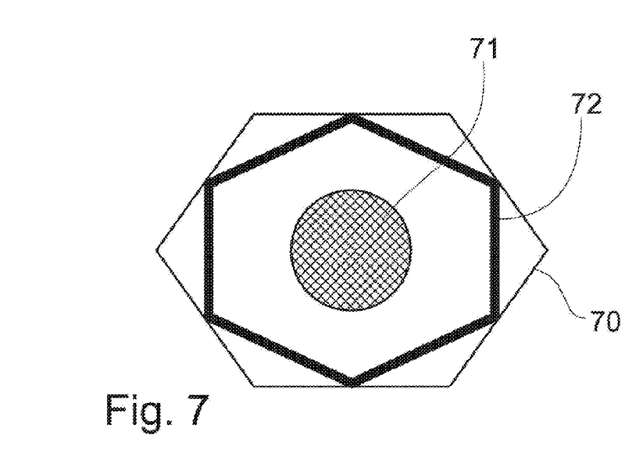
FIG. 7 is a sketch of an optical magnetometer according to a third embodiment of the invention.

Referring to FIG. 7, a zinc oxide (ZnO) hexagonal disk optical resonator 70 is chemically grown by, for example, self-assembly on a-plane sapphire substrates by high pressure pulsed laser deposition (PLD) utilizing a gold assisted growth mechanism. A central void is formed in the resonator using femtosecond laser ablation. Ferrite is ground into appropriate sized particles and one of the particles is selected under a microscope and manipulated using a micromanipulator. The micromanipulator is used to manually place the ferrite particle 71 inside the central void of the resonator. The ferrite is held in place using two-component epoxy, with two hour dry time (3M, St. Paul, Minn.) which is applied using the micromanipulator. Optical radiation 72 circulates in the resonator by total internal reflection.

Example 5

Figure 8:
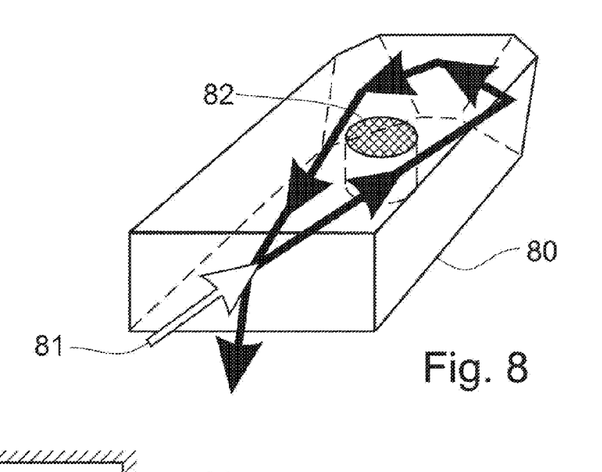
FIG. 8 is a sketch of an optical magnetometer according to a fourth embodiment of the invention.

Referring to FIG. 8, a non-planar ring oscillator (NPRO) 80 is fabricated through appropriate polishing of curved and flat surfaces on an optically transparent crystal. The optical radiation 82 resonates via total-internal reflection in a non-planar geometry. The optical radiation in this embodiment is directly coupled into the optical resonator, not evanescently coupled. A void is fabricated by drilling in a region of the crystal where the optical field is not present. A Terfenol-D rod is diced to form a disk 81 of appropriate size to fit inside the void, and held in place using epoxy. Typical dimensions for this embodiment are length of about 5 mm to about 25 mm but it is possible to fabricate the embodiment as small as 200 microns or as large as about 30 mm.

Example 6

Figure 9:
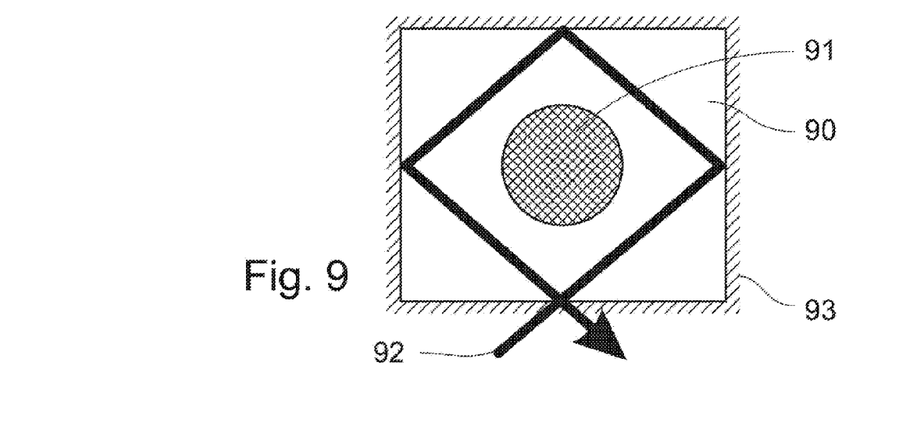
FIG. 9 is a sketch of an optical magnetometer according to a fifth embodiment of the invention.

Referring to FIG. 9, a square resonator 90 where light 92 resonates in a planar configuration can be fabricated using appropriate polishing of curved and flat surfaces on an optically transparent crystal, and dielectric surface coatings 93 applied. The optical radiation is directly coupled into the optical resonator and resonates via reflection from the dielectric coatings in a planar geometry, A void is fabricated through diamond turning on a region of the crystal where the optical field is not present. A Terfenol-D rod is diced to form a disk 91 of appropriate size to fit inside the void. The crystal resonator is strained (expanded) by elevating its temperature. This allows the Terfenol-D to be manually placed inside the void. When the strain is removed the crystal resonator contracts and holds the Terfenol-D in place by mechanical force.

Figure 10:
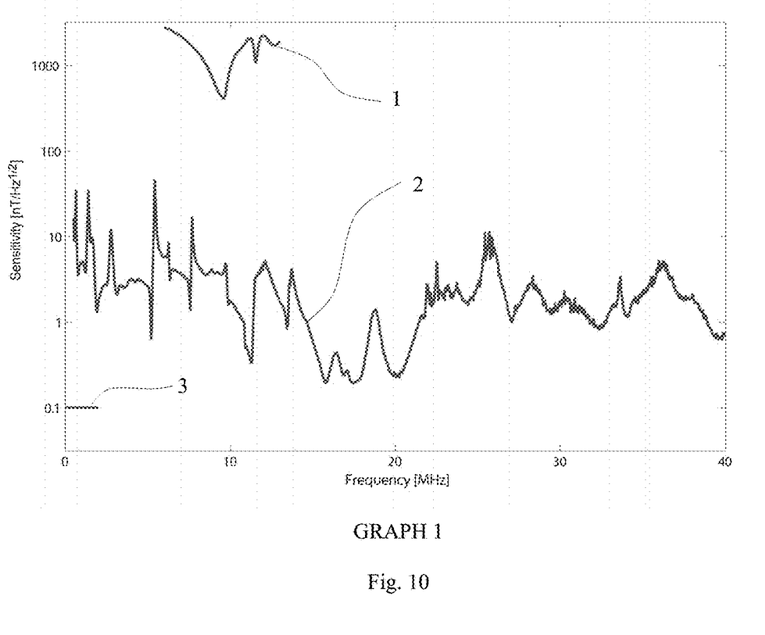
FIG. 10 Graph 1 demonstrates the difference in bandwidth and sensitivity between an optical magnetometer according to an embodiment of the present invention and two prior art devices.

As demonstrated in Graph 1, an optical magnetometer constructed according to an embodiment described above demonstrates significantly improved bandwidth and sensitivity compared to the device described in our earlier filed application. Graph 1 is a logarithmic scale so it shows two orders of magnitude improvement in peak sensitivity and a factor of 5 improvement in bandwidth between our earlier device constructed with a piece of Terfenol-D glued to the top of a toroid with epoxy (line 1) and the current device constructed in accordance with the embodiment of FIG. 5 (line 2). By way of comparison, the NV diamond device mentioned above (line 3) is reported to have better sensitivity but a much narrower bandwidth. The sensitivity and bandwidth shown by line 3 is estimated based on the information in the Physical Review B paper mentioned above.

The optical magnetometer has properties that make it particularly useful for a range of applications By way of a non-exhaustive indication of some of the applications the inventors propose that the optical magnetometer could be used for at least the following applications:

Detection of underwater craft (submarines) because the low cost and low power device is suited to networking using fibre-optics, and is suitable for remote detection as there is no requirement for cryogenics or vacuum;

Microfluidic MRI/NMR because the high bandwidth of the device enables for more sensitive detection of MRI signals. This is because in MRI a magnetization pulse is required to magnetize the sample. In order to maximize the signal a strong magnetization pulse is required. A stronger magnetization pulse results in a higher Larmor frequency in the sample, meaning higher detection frequency is necessary, especially in small volume samples such as in microfluidic MRI. Therefore, greater detector bandwidth increases sensitivity in MRI. In addition, the size (and therefore, resolution) of the device is similar to the dimensions of microfluidic channels in typical microfluidic platforms. This makes this sensor particularly suitable to incorporation into such architectures.

Ultralow Frequency (ULF) MRI because of the unique combination of high sensitivity and bandwidth. Also advantageous is the lack of necessity for cryogenic cooling. This is especially important in ULF MRI when application of a strong magnetic field is impractical. In such cases portability and low power usage are often important also.

Imaging and mapping of neurons because the dimensions of the device can be similar to that of neurons, and neurons produce magnetic fields close to the current sensitivity limits of the device.

Studying spin physics and condensed matter systems because of large bandwidth, low frequency operation, high sensitivity and small sensor volume.

Detection of precious elements because the low cost and low power device is suited to networking using fibre-optics, and is suitable for remote detection as there is no requirement for cryogenics or vacuum.

Circuit and Material characterization because of low size of sensor, high sensitivity and room temperature operation.

The above description of various embodiments of the present invention is provided for purposes of description to one of ordinary skill in the related art. It is not intended to be exhaustive or to limit the invention to a single disclosed embodiment. As mentioned above, numerous alternatives and variations to the present invention will be apparent to those skilled in the art of the above teaching. Accordingly, while some alternative embodiments have been discussed specifically, other embodiments will be apparent or relatively easily developed by those of ordinary skill in the art. Accordingly, this invention is intended to embrace all alternatives, modifications and variations of the present invention that have been discussed herein, and other embodiments that fall within the spirit and scope of the above described invention.

The invention claimed is:

1. An optical magnetometer comprising:
    an optical resonator having a central void; and
    a magnetostrictive material located in the central void such that a change in dimension of the magnetostrictive material causes a change in mechanical modes of the optical resonator due to the magnetorestrictive material expanding or contracting radially with respect to an inner surface of the optical resonator immediately adjacent to the central void.

2. The optical magnetometer of claim 1 wherein the optical resonator is a circular or elliptical whispering gallery mode resonator where the light circulates by grazing incidence total internal reflection around the perimeter of the resonator.

3. The optical magnetometer of claim 1 wherein the optical resonator has a diameter in the range of 5 microns to 30 millimeters.

4. The optical magnetometer of claim 1 wherein the optical resonator has a diameter in the range of 60 microns to 16 millimeters.

5. The optical magnetometer of claim 1 wherein the optical resonator is a microtoroid.

6. The optical magnetometer of claim 1 wherein the optical resonator is a substantially rectangular resonator where light circulates by reflection from dielectric coatings on the surface of the resonator.

7. The optical magnetometer of claim 1 wherein the magnetostrictive material is selected from Terfenol-D (an alloy of terbium, dysprosium and iron), Galfenol (an alloy of iron and gallium), Metglas (a proprietary iron based amorphous alloy available from Metglas Inc), and Ferrite (doped crystalline iron).

8. An optical magnetometer comprising:
    an optical resonator having optical modes and mechanical modes, the optical resonator having a central void;
    a tunable laser producing optical radiation at a laser frequency locked to an optical mode frequency of the optical resonator and coupled into the optical resonator;
    a magnetostrictive material located in the central void such that a change in dimension of the magnetostrictive material causes a change in mechanical modes of the optical resonator due to the magnetorestrictive material expanding or contracting radially with respect to an inner surface of the optical resonator immediately adjacent to the central void; and
    an optical detector that detects changes in the optical radiation due to changes in the mechanical modes.

* * * * *